(12) United States Patent
White et al.

(10) Patent No.: US 8,019,957 B1
(45) Date of Patent: *Sep. 13, 2011

(54) METHOD AND SYSTEM FOR AUTOMATIC CALIBRATION OF A DQS SIGNAL IN A STORAGE CONTROLLER

(75) Inventors: Theodore C. White, Rancho Santa Margarita, CA (US); Thanh H. Le, Yorba Linda, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/874,349

(22) Filed: Sep. 2, 2010

Related U.S. Application Data

(63) Continuation of application No. 11/526,398, filed on Sep. 25, 2006, now Pat. No. 7,793,063.

(60) Provisional application No. 60/721,690, filed on Sep. 29, 2005.

(51) Int. Cl.
*G06F 12/00* (2006.01)
*G01D 18/00* (2006.01)
*G01C 7/06* (2006.01)
*G01C 7/00* (2006.01)

(52) U.S. Cl. .................. 711/167; 702/89; 365/189.07; 365/193; 711/E12.017

(58) Field of Classification Search .................. None
See application file for complete search history.

(56) References Cited

U.S. PATENT DOCUMENTS

| | | | |
|---|---|---|---|
| 6,760,856 B1 | 7/2004 | Borkenhagen et al. | |
| 7,412,616 B2 * | 8/2008 | Matsui et al. ................. | 713/401 |
| 7,512,193 B1 | 3/2009 | Shing et al. | |
| 2002/0184461 A1 | 12/2002 | Zumkehr | |
| 2006/0052961 A1 | 3/2006 | Best | |

* cited by examiner

*Primary Examiner* — Reginald G Bragdon
*Assistant Examiner* — Aracelis Ruiz

(57) ABSTRACT

A calibration module for a data storage control system. The calibration system includes a programmable delay module configured to i) receive a data strobe signal, ii) receive a delay value, and iii) output a delayed data strobe signal to a buffer based on the delay value, wherein data is read from the buffer based on the delayed data strobe signal. The calibration module further includes a delay calculation module configured to calculate the delay value based on a comparison between the data strobe signal and the delayed data strobe signal.

18 Claims, 10 Drawing Sheets

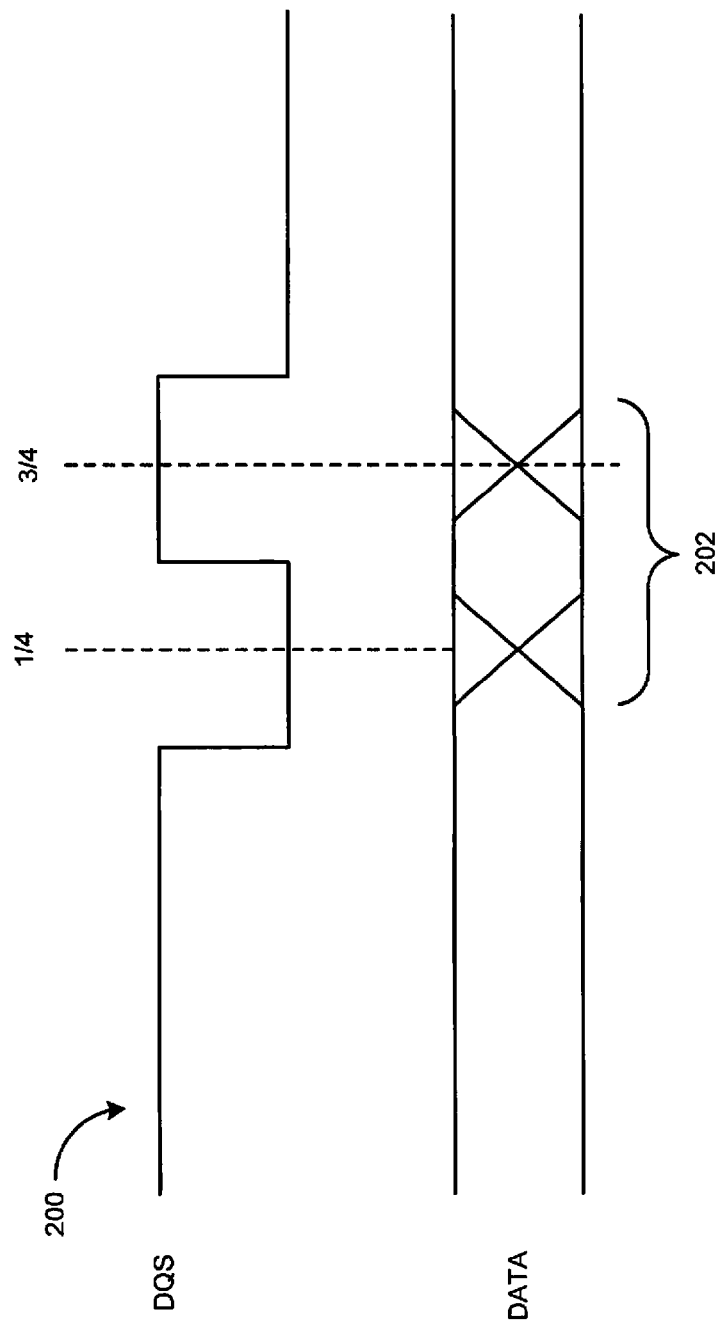

METHOD AND SYSTEM FOR AUTOMATIC CALIBRATION OF A DQS SIGNAL IN A STORAGE CONTROLLER

CROSS-REFERENCE TO RELATED APPLICATIONS

This application is a continuation of U.S. Non-Provisional application Ser. No. 11/526,398, filed Sep. 25, 2006, now U.S. Pat. No. 7,793,063, which claims the benefit of U.S. Provisional Application No. 60/721,690, filed Sep. 29, 2005. The disclosures of the above applications are incorporated herein by reference.

FIELD

The present disclosure relates to the automatic calibration of double-data-rate synchronous dynamic random access memory (DDR SDRAM) clock signals in storage controllers.

BACKGROUND

Host devices such as computers, laptops, personal video recorders (PVRs), MP3 players, game consoles, servers, set-top boxes, digital cameras, and/or other electronic devices often need to store a large amount of data. Storage devices such as hard disk drives (HDDs) may be used to meet these storage requirements.

A hard disk controller (HDC) communicates with the storage device and the host system. The HDC manages interaction between the storage device and the host system. Communication between the host system and the HDC is usually provided using one of a variety of standard I/O bus interfaces. Typically, when data is read from a storage device, a host system sends a read command to the HDC, which stores the read command into a buffer memory. Data is read from the storage device and stored in a buffer memory.

The buffer memory typically includes volatile memory having low latency. The buffer memory may be a synchronous dynamic random access memory (SDRAM), or double data rate synchronous dynamic random access memory (DDR SDRAM) (referred to herein as "DDR"). Typically, SDRAM transfers data at the positive edge of a clock signal at the HDC. In contrast, DDR memory transfers data on a rising and falling edge of a clock signal of the HDC. Hence, SDRAM is a single data rate memory device and DDR memory has double the transfer rate of SDRAM.

In DDR systems, address and commands are managed similarly to SDRAM systems. However, DDR systems manage data further based on a separate clock signal such as a data strobe signal (DQS). For example, the DDR memory generates the DQS during read operations. DDR systems transfer data to and/or from the DDR memory based on the DQS. Typically, DQS signals are delayed with respect to the data that is read from a DDR-based buffer memory.

SUMMARY

A calibration system for a data storage device includes a memory and a memory control module. The memory buffers data between a host and the data storage device and generates a data strobe signal. The memory control module selectively adjusts a delay of the data strobe signal. Data is read from the memory based on the data strobe signal.

In other features, the memory control module includes a first logic module that receives the data strobe signal and a clock signal. The memory control module adjusts the delay of the data strobe signal based on the clock signal. The memory control module includes a second logic module that selectively outputs one of the data strobe signal and the clock signal based on a calibration signal. The memory control module adjusts the delay when the memory control module is not reading data from the memory.

In other features, the memory control module includes a programmable delay module that outputs a delayed data strobe signal based on the delay. The memory control module includes a pulse detection module that receives the data strobe signal and the delayed data strobe signal and that generates a pulse detection signal based on a comparison between the data strobe signal and the delayed data strobe signal. The memory control module includes a delay calculation module that generates the delay based on the pulse detection signal. The programmable delay module receives the delay from the delay calculation module.

In other features, the memory is a double data rate synchronous dynamic random access memory. A hard disk drive (HDD) includes the calibration system. The delay calculation module includes a counter module that increments a count value based on the pulse detection signal. The delay calculation module includes a calculator module that calculates the delay based on the count value.

A calibration system for a data storage device includes memory means for buffering data between a host and the data storage device and for generating a data strobe signal and memory control means for selectively adjusting a delay of the data strobe signal. Data is read from the memory means based on the data strobe signal.

In other features, the memory control means includes a first logic means for receiving the data strobe signal and a clock signal. The memory control means adjusts the delay of the data strobe signal based on the clock signal. The memory control means includes a second logic means for selectively outputting one of the data strobe signal and the clock signal based on a calibration signal. The memory control means adjusts the delay when the memory control means is not reading data from the memory means.

In other features, the memory control means includes a programmable delay means for outputting a delayed data strobe signal based on the delay. The memory control means includes a pulse detection means for receiving the data strobe signal and the delayed data strobe signal and for generating a pulse detection signal based on a comparison between the data strobe signal and the delayed data strobe signal. The memory control means includes a delay calculation means for generating the delay based on the pulse detection signal. The programmable delay means receives the delay from the delay calculation means.

In other features, the memory means is a double data rate synchronous dynamic random access memory. A hard disk drive (HDD) includes the calibration system. The delay calculation means includes a counter means for incrementing a count value based on the pulse detection signal. The delay calculation means includes a calculator means for calculating the delay based on the count value.

A calibration method for a data storage device includes buffering data between a host and the data storage device and generating a data strobe signal and selectively adjusting a delay of the data strobe signal. Data is read from a memory based on the data strobe signal.

In other features, the method further comprises receiving the data strobe signal and a clock signal. The method further comprises adjusting the delay of the data strobe signal based on the clock signal. The method further comprises selectively outputting one of the data strobe signal and the clock signal based on a calibration signal. The method further comprises adjusting the delay when data is not read from the memory.

In other features, the method further comprises outputting a delayed data strobe signal based on said delay. The method further comprises receiving the data strobe signal and the delayed data strobe signal and generating a pulse detection signal based on a comparison between the data strobe signal and the delayed data strobe signal. The method further comprises generating the delay based on the pulse detection signal. The method further comprises receiving the delay from a delay calculation module.

In other features, the memory is a double data rate synchronous dynamic random access memory. A hard disk drive (HDD) includes the method. The method further comprises incrementing a count value based on the pulse detection signal. The method further comprises calculating the delay based on the count value.

A computer program stored for use by a processor for operating a calibration system in a storage device includes buffering data between a host and the data storage device and generating a data strobe signal and selectively adjusting a delay of the data strobe signal. Data is read from a memory based on the data strobe signal.

In other features, the computer program further comprises receiving the data strobe signal and a clock signal. The computer program further comprises adjusting the delay of the data strobe signal based on the clock signal. The computer program further comprises selectively outputting one of the data strobe signal and the clock signal based on a calibration signal. The computer program further comprises adjusting the delay when data is not read from the memory.

In other features, the computer program further comprises outputting a delayed data strobe signal based on said delay. The computer program further comprises receiving the data strobe signal and the delayed data strobe signal and generating a pulse detection signal based on a comparison between the data strobe signal and the delayed data strobe signal. The computer program further comprises generating the delay based on the pulse detection signal. The computer program further comprises receiving the delay from a delay calculation module.

In other features, the memory is a double data rate synchronous dynamic random access memory. A hard disk drive (HDD) includes the computer program. The computer program further comprises incrementing a count value based on the pulse detection signal. The computer program further comprises calculating the delay based on the count value.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5 is a timing diagram illustrating a calibrated data strobe signal (DQS) centered within a valid data window;

DETAILED DESCRIPTION

Figure 1:
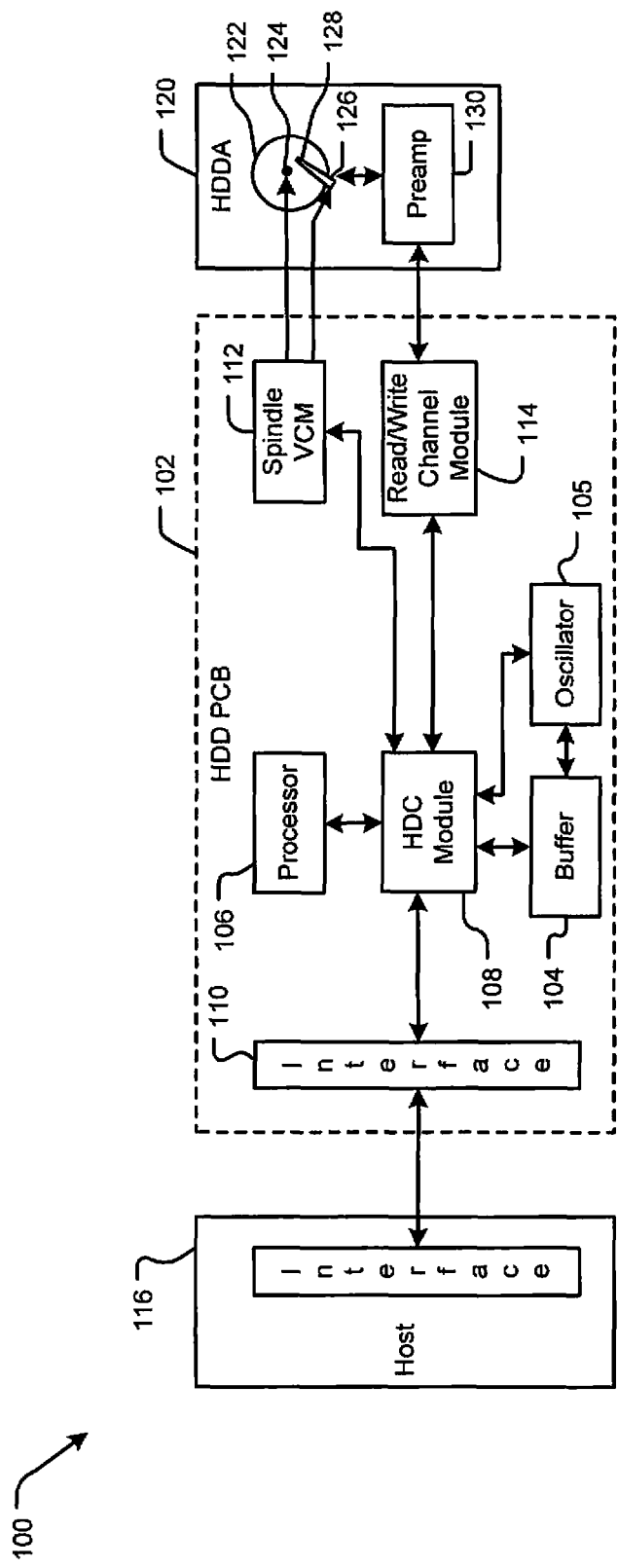
FIG. 1 is a functional block diagram of a hard disk drive (HDD) system according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Referring now to FIG. 1, an exemplary hard disk drive (HDD) system 100 that implements the calibration system is shown to include a HDD printed circuit board (PCB) 102. A memory module such as buffer 104 stores read, write and/or volatile control data that is associated with the control of the HDD system 100. The buffer 104 usually employs volatile memory having low latency. For example, SDRAM, double data rate (DDR), or other types of low latency memory may be used. Nonvolatile memory such as flash memory may also be provided to store critical data such as nonvolatile control code. The buffer 104 communicates with an oscillator 105.

A processor 106 arranged on the HDD PCB 102 performs data and/or control processing that is related to the operation of the HDD system 100. A hard disk control (HDC) module 108 communicates with an input/output interface 110, with a spindle/voice coil motor (VCM) driver or module 112, the oscillator 105, and/or a read/write channel module 114. The HDC module 108 coordinates control of the spindle/VCM module 112, the read/write channel module 114, and the processor 106 and data input/output with a host 116 via the interface 110.

A hard disk drive assembly (HDDA) 120 includes one or more hard drive platters 122 that include magnetic coatings that store magnetic fields. The platters 122 are rotated by a spindle motor that is schematically shown at 124. Generally the spindle motor 124 rotates the hard drive platters 122 at a controlled speed during the read/write operations. One or more read/write arms 126 move relative to the platters 122 to read and/or write data to/from the hard drive platters 122. The spindle/VCM module 112 controls the spindle motor 124, which rotates the platters 122. The spindle/VCM module 112 also generates control signals that position the read/write arm 126, for example using a voice coil actuator, a stepper motor or any other suitable actuator.

During write operations, the read/write channel module 114 encodes the data to be written with a read/write device 128. The read/write channel module 114 processes the write signal for reliability and may apply, for example, error correction coding (ECC), run length limited coding (RLL), and the like. During read operations, the read/write channel module 114 converts an analog read signal output of the read/write device 128 to a digital read signal. The converted signal is then detected and decoded by known techniques to recover the data that was written on the platters 122.

The read/write device 128 is located near a distal end of the read/write arm 126. The read/write device 128 includes a write element such as an inductor that generates a magnetic field. The read/write device 128 also includes a read element (such as a magneto-resistive (MR) element) that senses the magnetic field on the platters 122. The HDDA 120 includes a preamplifier circuit or module 130 that amplifies the analog read/write signals. When reading data, the preamplifier module 130 amplifies low level signals from the read element and outputs the amplified signal to the read/write channel module 114. While writing data, a write current is generated that flows through the write element of the read/write device 128. The write current is switched to produce a magnetic field having a positive or negative polarity. The positive or negative polarity is stored by the hard drive platters 122 and is used to represent data.

The data is stored on the platters 122 in sectors. Each sector is byte structured and includes various fields according to a sector format. Typically, a sector format includes a logical block address (LBA) field followed by a data field, a cyclic redundancy check (CRC) checksum field, and/or an ECC field. For example, the LBA field may include 4 bytes data, the data field may include 512 bytes of data, the CRC checksum field may include 4 bytes of data, and the ECC field may include 40-80 bytes of data. The LBA includes position information such as cylinder, head, and/or sector numbers.

Portions of the HDD system 100 may be implemented by one or more integrated circuits (IC) or chips. For example, the processor 106 and the HDC module 108 may be implemented by a single chip. The spindle/VCM module 112 and/or the read/write channel module 114 may also be implemented by the same chip as the processor 106, the HDC module 108 and/or by additional chips. Alternatively, most of the HDD system 100 other than the HDDA 120 may be implemented as a system on chip (SOC).

Figure 2:
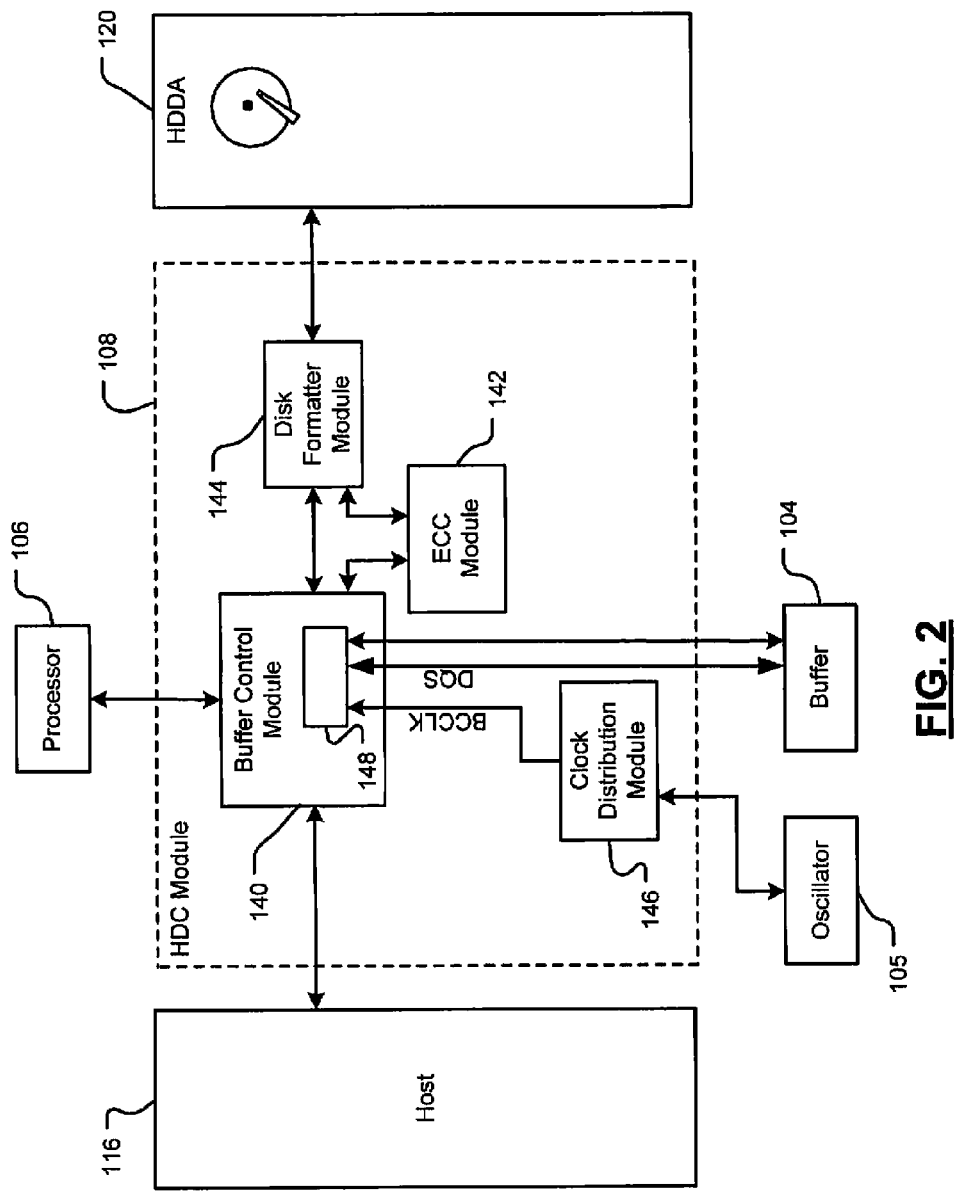
FIG. 2 is a functional block diagram of a hard disk control (HDC) module according to the present disclosure.

Referring now to FIG. 2, the HDC module 108 is shown in more detail. The HDC module 108 communicates with the buffer 104, the oscillator 105, the processor 106, the host 116, and the HDDA 120 as described in FIG. 1. The HDC module 108 includes a buffer control module 140, an ECC module 142, a disk formatter module 144, and a clock distribution module 146.

The buffer control module 140 (e.g. a direct memory access (DMA) controller) connects the buffer 104 to the clock distribution module 146, the disk formatter module 144, the ECC module 142, the host 116, the processor 106, and the HDDA 120. The buffer control module 140 regulates data movement in and out of the buffer 104.

The clock distribution module 146 communicates with the oscillator 105 and the buffer control module 140. The clock distribution module 146 manages clock variations and generates a buffer clock signal (BCCLK).

The buffer control module 140 of the present disclosure includes a calibration module 148. The calibration module 148 communicates with the clock distribution module 146 and the buffer 104. The calibration module 148 receives the BCCLK from the clock distribution module 146 and a DQS signal from the buffer 104. The calibration module 148 calculates a DQS delay value based on the BCCLK or another clock signal and delays the DQS signal based on the DQS delay value. For example, the calibration module 148 uses the BCCLK to calculate the DQS delay value during DQS calibration cycles. In the present implementation, DQS calibration cycles may coincide with idle periods of the buffer 104.

During normal operation, the calibration module 148 outputs a delayed DQS based on the DQS delay value. The buffer control module 140 uses the DQS delay signal as a clock signal to meet the timing requirements between the DQS signal and data. The DQS delay signal serves as a data sampling delay with respect to the read and/or write commands to the buffer 104. In various embodiments, the calibration module 148 delays the DQS signal by ¼ of a frequency (i.e. ½ of a high clock width of the DQS signal) of the DQS signal. In various embodiments, the calibration module 148 may be implemented by an existing integrated circuit and/or by additional integrated circuits. Alternatively, the calibration module 148 may be implemented as a SOC.

The host 116 sends read and write commands to the HDC module 108. The HDC module 108 stores the read and write commands in the buffer 104. The processor 106 receives the read and write commands from the buffer 104 and executes firmware to control the HDC module 108 accordingly. During read operations, the HDC module 108 reads data corresponding to the read commands from the HDDA 120. The buffer control module 140 and the ECC module 142 receive the data from the HDDA 120. The ECC module 142 provides an ECC mask for errors that may have occurred during read operations while the data is still in the buffer control module 140. After any errors in the data are corrected, the data is transferred to the buffer 104. The data is then transferred from the buffer 104 to the host 116.

During write operations, the disk formatter module 144 controls writing of data to the HDDA 120. The buffer 104 receives data corresponding to the write commands via the HDC module 108. The disk formatter module 144 receives the data from the buffer 104 via the HDC module 108. The disk formatter module 144 formats the data for writing to the HDDA 120. For example, the disk formatter module 144 adds error correction codes to the data, monitors a position of the read/write heads, and writes the data to the read/write heads as described in FIG. 1.

Figure 3:
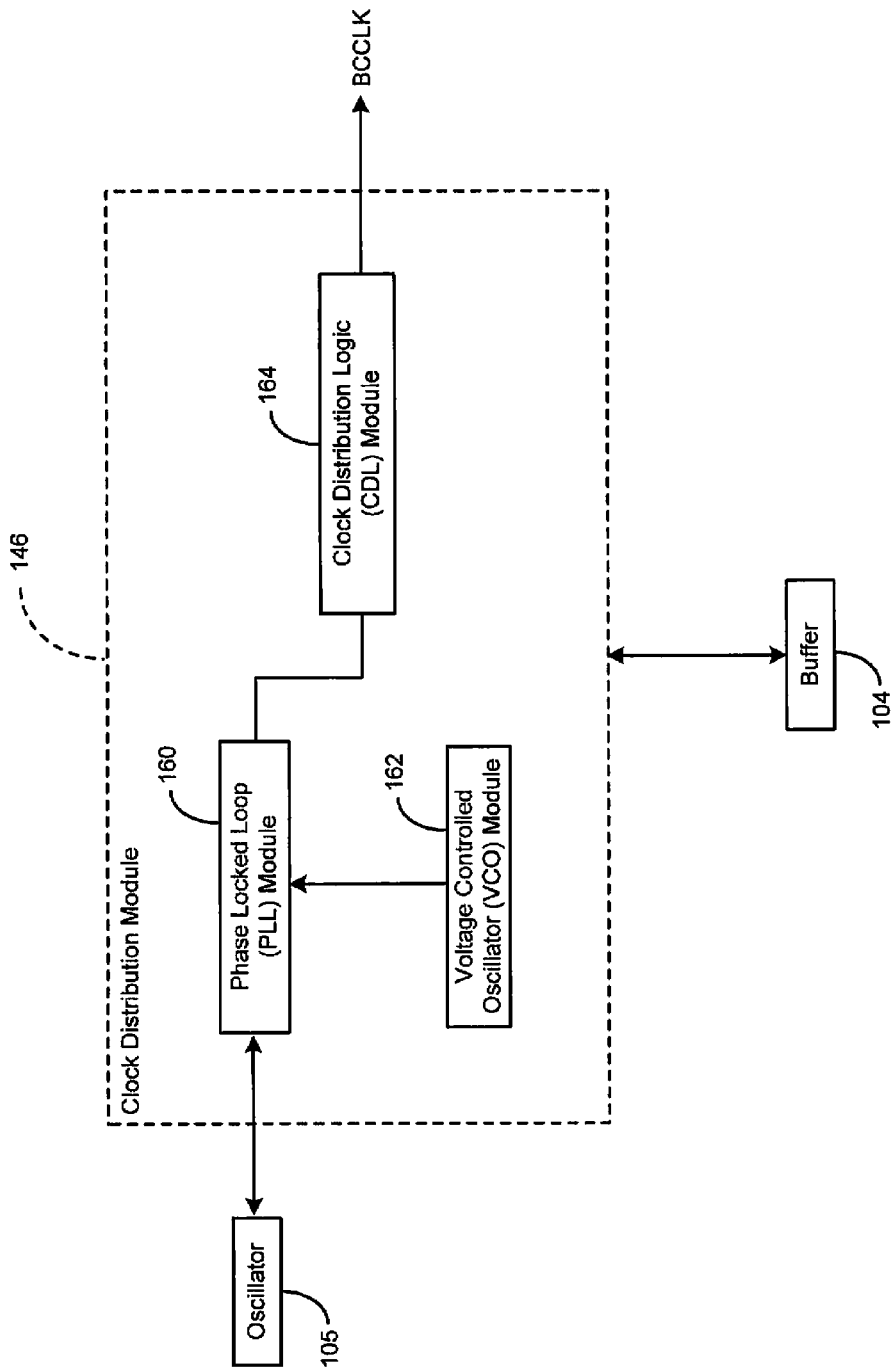
FIG. 3 is a functional block diagram of a clock distribution module according to the present disclosure.

Referring now to FIG. 3, an exemplary embodiment of the clock distribution module 146 is shown in more detail. The clock distribution module 146 communicates with the buffer control module 140 and the oscillator 105. The clock distribution module 146 includes a phase locked loop (PLL) module 160, a voltage regulator (VCO) module 162, and a clock distribution logic (CDL) module 164. The PLL module 160 controls the oscillator 105 in order to maintain a constant phase angle (i.e. lock) on a frequency of an input or reference signal. The PLL module 160 communicates with the VCO module 162 and the CDL module 164. The CDL module 164 generates and outputs the BCCLK.

Figure 4A:
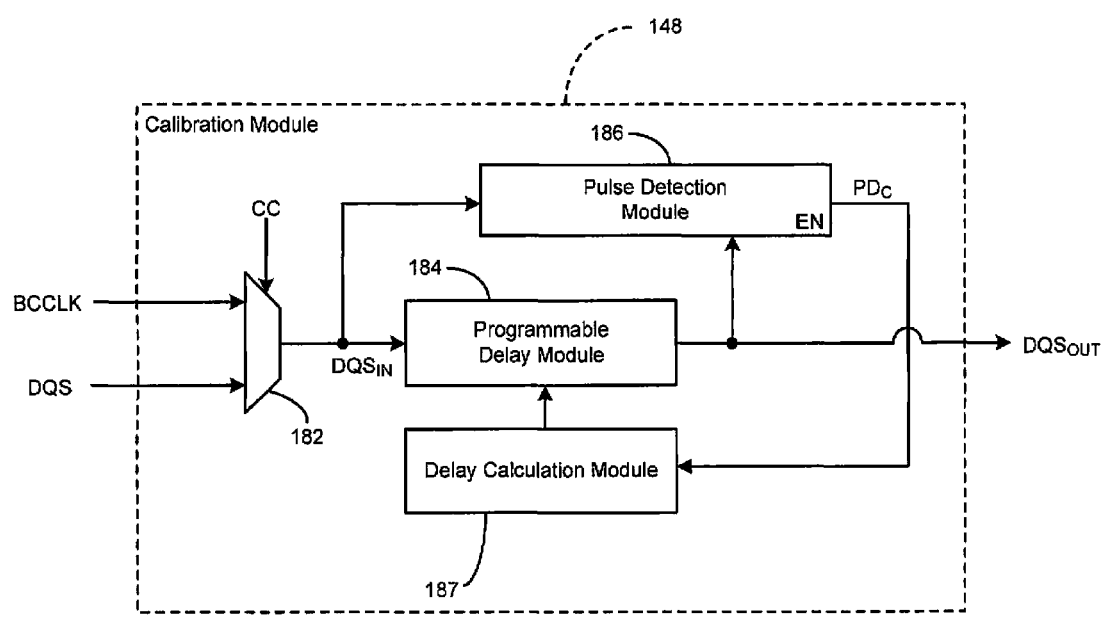
FIG. 4A is a functional block diagram of a calibration module according to the present disclosure.

Referring now to FIG. 4A, an exemplary embodiment of the calibration module 148 is shown. The calibration module 148 receives the DQS signal and data from the buffer 104. The calibration module 148 includes a logic module 182 (such as a multiplexer), a programmable delay module 184, a pulse detection module 186, and a delay calculation module 187. The calibration module 148 determines the DQS delay value during a calibration cycle. The programmable delay module 184 applies the DQS delay value to the DQS signal. The calibration module 148 delays the DQS signal based on the DQS delay value that is based on one of a calculated delay value or a state machine delay value. In the present implementation, the calibration module 148 determines an optimal delay that is compatible with worst-case (e.g. 3 nanoseconds) and best-case (e.g. 1.5 nanoseconds) delay conditions by dynamically adjusting the DQS delay value. The dynamic adjustment allows for increased transfer rates to and/or from the buffer 104.

For example, the logic module 182 receives the DQS and the BCCLK, as well as a calibration cycle (CC) select signal. During read operations, the CC select signal selects the DQS and the logic module 182 outputs a DQS input signal ($DQS_{IN}$) accordingly. The programmable delay module 184 delays $DQS_{IN}$ based on the programmable delay value and outputs a delayed DQS output signal ($DQS_{OUT}$).

During calibration cycles (e.g. during idle periods of the buffer 104), the CC select signal selects the BCCLK and the logic module 182 outputs $DQS_{IN}$ based on the BCCLK. In other words, during idle periods, the buffer 104 does not generate the DQS and the calibration module 148 calibrates the programmable delay based on the BCCLK. Those skilled in the art can appreciate that other clock signals may be used. The programmable delay module 184 delays $DQS_{IN}$ and outputs $DQS_{OUT}$. The pulse detection module 186 receives and compares phases of $DQS_{IN}$ and $DQS_{OUT}$ and outputs a pulse detection signal $PD_C$ based on a delay between $DQS_{IN}$ and $DQS_{OUT}$. The delay calculation module 187 receives the pulse detection signal $PD_C$ and can program the programmable delay module 187 with a calculated delay value based on $PD_C$. In other words, the delay calculation module 187 can calculate the DQS delay based on feedback from the pulse detection module 186.

Figure 4B:
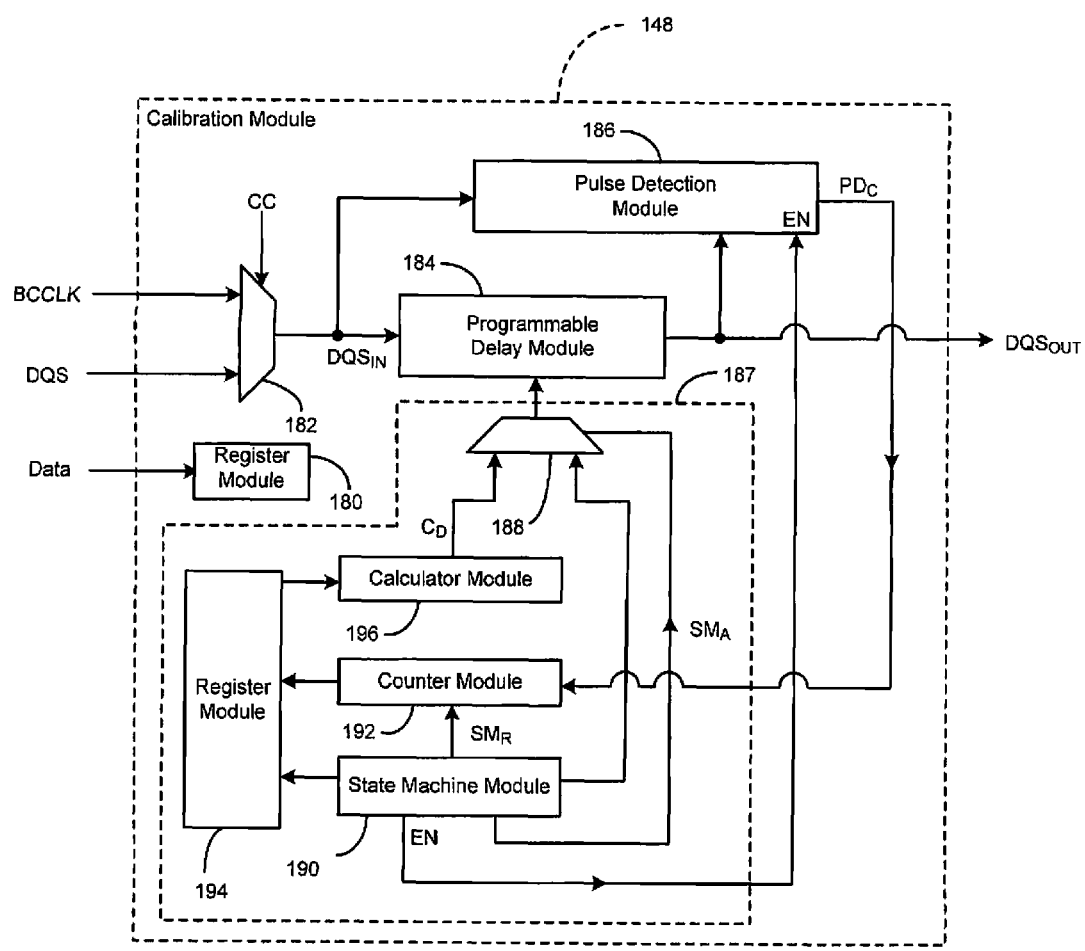
FIG. 4B is a functional block diagram of a calibration module shown in more detail according to the present disclosure.

Referring now to FIGS. 4A and 4B, an exemplary embodiment of the delay calculation module 187 is shown in more detail. The delay calculation module 187 includes a logic module 188 (such as a multiplexer), a state machine module 190, a counter module 192, a register module 194, and a calculator module 196. A register module 180 receives and stores the data. The programmable delay module 184 delays $DQS_{IN}$ based on the DQS delay value received from the logic module 188. The logic module 188 outputs the DQS delay value based on one of a calculated delay value $C_D$ received from the calculator module 196 and a state machine delay value received from the state machine module 190.

For example, the logic module 188 selectively outputs one of the calculated delay value $C_D$ and the state machine delay value based on a control signal $SM_A$ received from the state machine module 190. In other words, the state machine module 190 may override the calculated delay value $C_D$ with the state machine delay value. As such, the state machine module 190 determines the delay of the DQS signal. In the present implementation, the state machine module 190 cycles through a plurality of delay values (e.g. 0 to 31) during each calibration cycle. The calibration cycle is complete after the calibration module 148 tests the maximum delay value of the plurality of delay values. In the present implementation, the calibration module 148 executes calibration cycles to compensate for process, voltage, and/or temperature variations of the HDD system 100. Upon initiation of a calibration cycle, the state machine module 190 transmits an enable signal EN to the pulse detection module 186.

As described above with respect to FIG. 4A, the pulse detection module 186 receives and compares phases of $DQS_{IN}$ and $DQS_{OUT}$. More specifically, the pulse detection module 186 determines the delay of $DQS_{OUT}$ with respect to $DQS_{IN}$. The pulse detection module 186 determines whether the delay is above or below a threshold value. The threshold value represents a desired delay of the DQS (e.g. one-half clock period). For example, the pulse detection module 186 generates the pulse detection signal $PD_C$ when there is an overlap between pulses of $DQS_{IN}$ and $DQS_{OUT}$ (i.e. the delay is less than one-half clock period). When there is no overlap between the pulses (i.e. the delay is approximately one-half clock period), the pulse detection module 186 does not generate the pulse detection signal $PD_C$.

The pulse detection module 186 transmits the pulse detection signal $PD_C$ to the counter module 192. The counter module 192 increments a count value based on the pulse detection signal $PD_C$. For example, the counter module 192 increments the count value when the counter module 192 receives a stream of the pulse detection signal $PD_C$ during a particular calibration cycle. Conversely, the counter module 192 does not increment the count value when the pulse detection signal $PD_C$ is not generated by the pulse detection module 186 during a calibration cycle. The state machine module 190 may reset the operation of the calibration module 148 by transmitting a reset signal ($SM_R$) to the counter module 192.

The register module 194 stores the count value received from the counter module 192 and transmits the count value to the calculator module 196. The register module 194 may also store delay values calculated in a particular calibration cycle for future use by the calibration module 148 during subsequent calibrations. The calculator module 196 calculates the calculated delay value $C_D$ by dividing the count value by a divide value (e.g. 2). In various embodiments, the calculator module 196 can add or subtract a bias value (e.g. 1 or 2) to the calculated delay value $C_D$ to compensate for nonlinearities of the calculated delay value $C_D$ based on inequalities in wiring delays.

Referring now to FIG. 5, a timing diagram illustrates a calibrated DQS signal 200 centered within a valid data window 202. The DQS signal 200 controls the sampling of data from the buffer 104. Centering the data read operation within the DQS signal window 202 allows for improved data transfer rates to and/or from the buffer 104 and prevents false readings.

Figure 6:
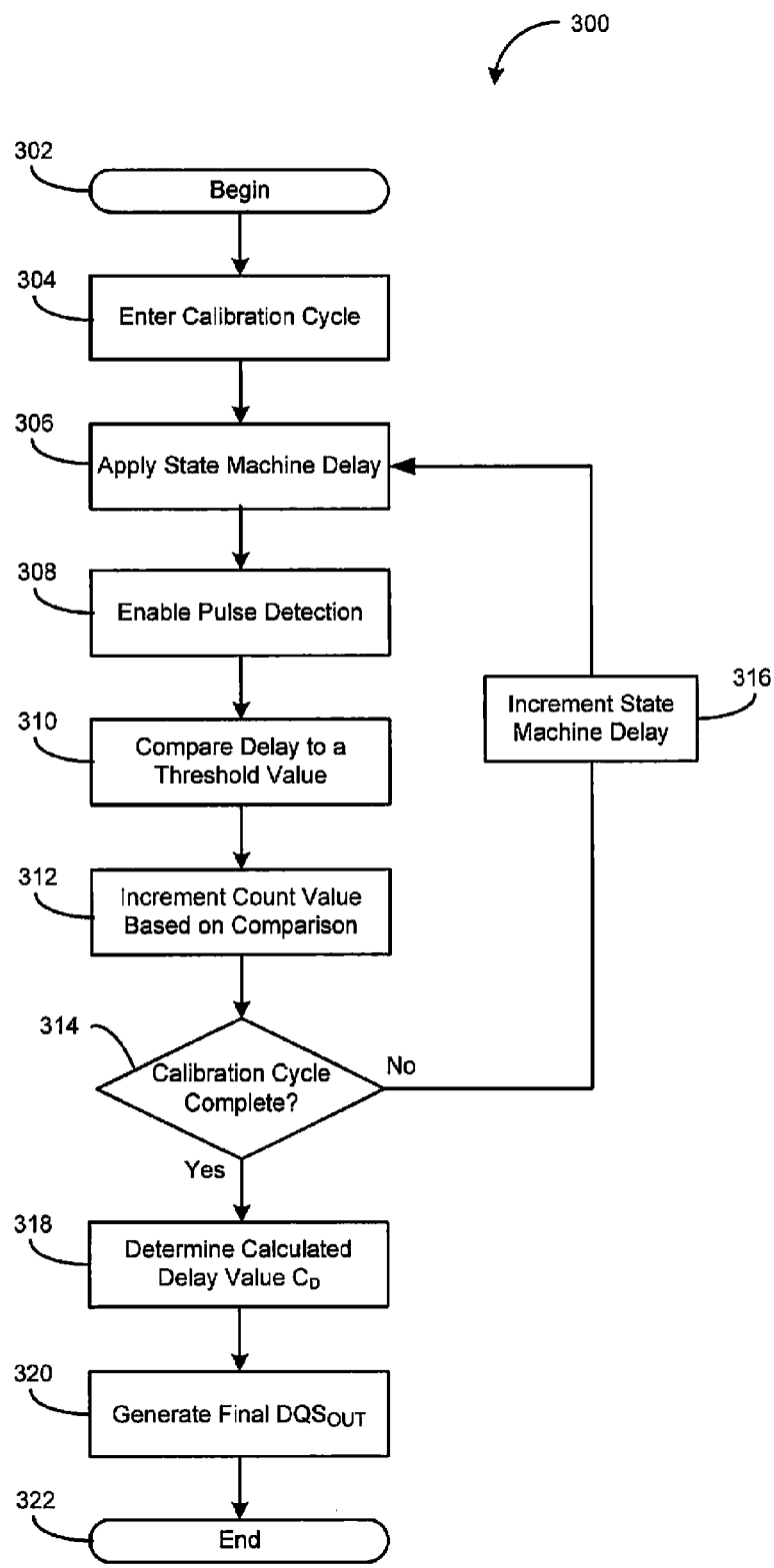
FIG. 6 is a flow diagram illustrating steps of a method for calibrating a DQS according to the present disclosure.

Referring now to FIG. 6, a method 300 for executing a calibration cycle is shown in more detail. The method 300 begins at step 302. In step 304, the state machine module 190 enters a calibration cycle after counter module 192 is cleared from a previous calibration cycle. In step 306, the state machine module 190 transmits a state machine delay value to the programmable delay module 184. In step 308, the state machine module 190 enables the pulse detection module 186. In step 310, the pulse detection module 186 compares the $DQS_{OUT}$ with a threshold value. In step 312, the counter module 192 increments a count value based on a pulse detection signal $PD_C$ generated by the pulse detection module 186. In step 314, the calibration module 148 determines whether the calibration cycle is complete. If the calibration cycle is not complete, the calibration module 148 proceeds to step 316. In step 316, the state machine module 190 increments the state machine delay and returns to step 306. If the calibration cycle is complete, the calibration module 148 proceeds to step 318.

In step 318, the calculator module 196 calculates a calculated delay value $C_D$ based on the count value. In step 320, the programmable delay module 184 generates $DQS_{OUT}$ based on the calculated delay value $C_D$. The method 300 ends in step 318.

Figure 7B:
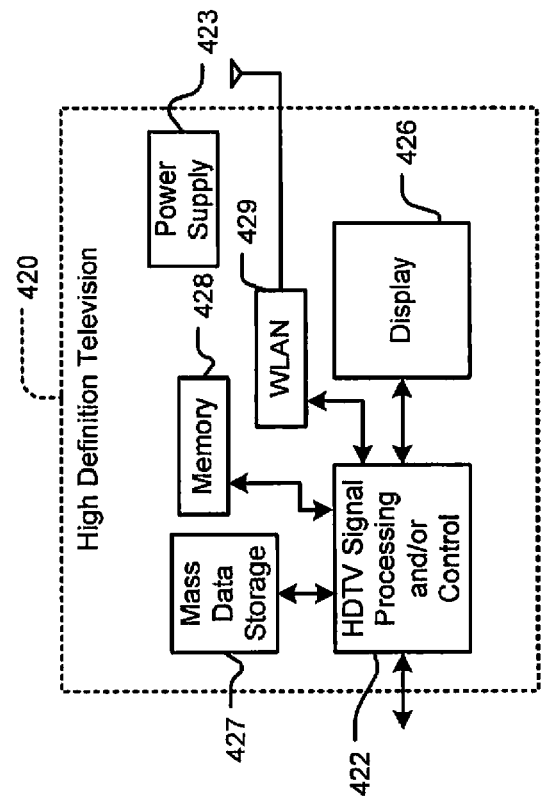
FIG. 7B is a functional block diagram of a high definition television.
Figure 7A:
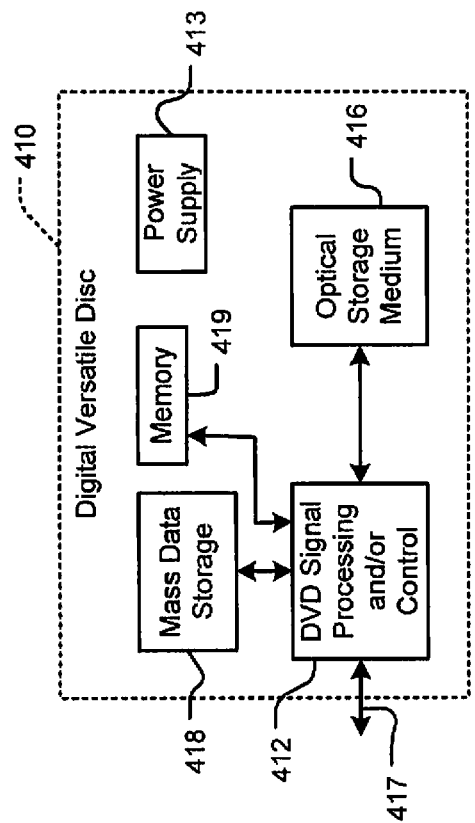
FIG. 7A is a functional block diagram of a digital versatile disk (DVD)

Referring now to FIGS. 7A-7F, various exemplary implementations of the calibration system are shown. As shown in FIG. 7A, the calibration system can be implemented in a digital versatile disc (DVD) drive 410. The DVD drive 410 includes either or both signal processing and/or control circuit, which are generally identified in FIG. 7A at 412, mass data storage 418 and/or a power supply 413. The mass data storage 418 may implement the calibration system. The signal processing and/or control circuit 412 and/or other circuits (not shown) in the DVD drive 410 may process data, perform coding and/or encryption, perform calculations, and/or format data that is read from and/or data written to an optical storage medium 416. In some implementations, the signal processing and/or control circuit 412 and/or other circuits (not shown) in the DVD drive 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD drive 410 may communicate with mass data storage 418 that stores data in a nonvolatile manner. The mass data storage 418 may include a hard disk drive (HDD). The HDD may have the configuration shown in FIG. 1. The HDD may be a mini HDD that includes one or more platters having a diameter that is smaller than approximately 1.8". The DVD drive 410 may be connected to memory 419 such as RAM, ROM, low latency nonvolatile memory such as flash memory and/or other suitable electronic data storage.

Referring now to FIG. 7B, the calibration system can be implemented in a high definition television (HDTV) 420. The HDTV 420 includes either or both signal processing and/or control circuit, which are generally identified in FIG. 7B at 422, a WLAN interface 429, mass data storage 627, and/or a power supply 423. The mass data storage 427 may implement the calibration system. For example, the mass data storage 427 may include one or more buffer memories that temporarily store data that is transmitted to and from the HDTV 420. The memory controller module that manages the buffer memories may implement the calibration system. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices including, but not limited to, DVD drives and HDDs. At least one HDD may have the configuration shown in FIG. 1 and/or at least one DVD drive may have the configuration shown in FIG. 7A. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with the WLAN via the WLAN interface 429.

Figure 7D:
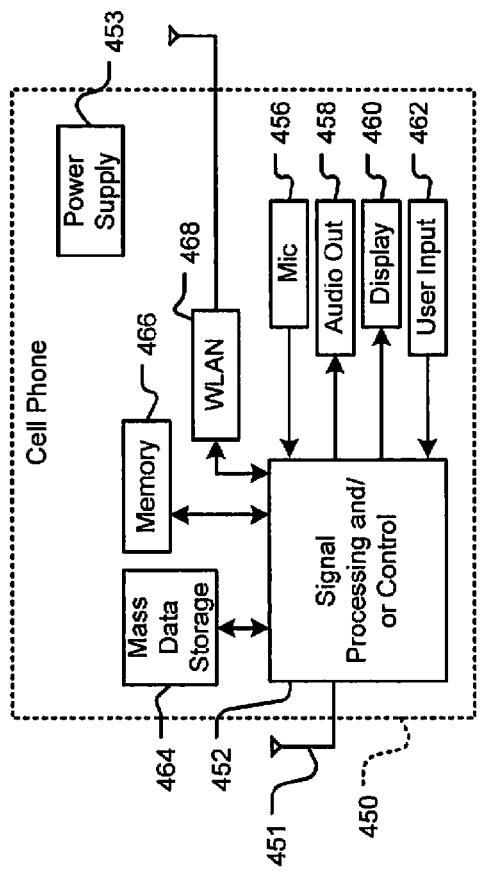
FIG. 7D is a functional block diagram of a cellular phone.
Figure 7C:
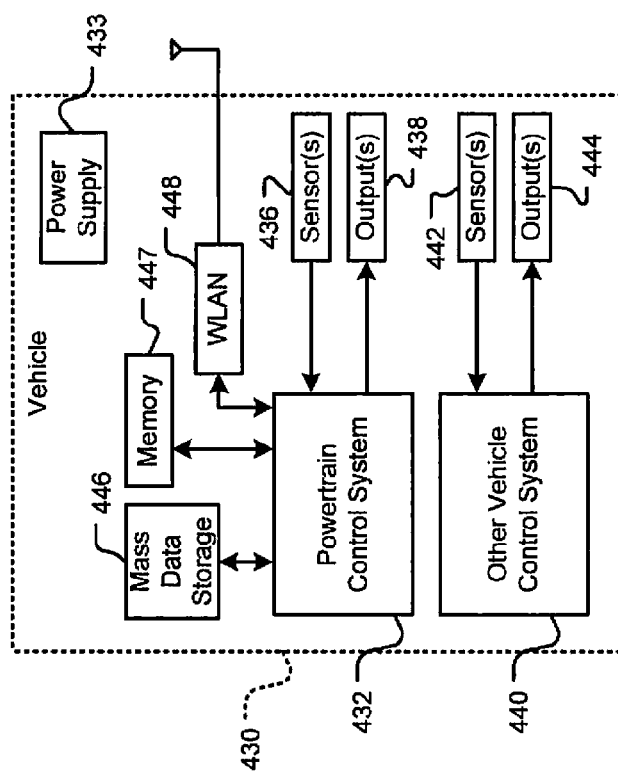
FIG. 7C is a functional block diagram of a vehicle control system.

Referring now to FIG. 7C, the vehicle 430 includes a powertrain control system 432, a WLAN interface 448, mass data storage 446 and/or a power supply 433. The mass data storage 446 may implement the calibration system. For example, the mass data storage 446 may include one or more buffer memories that temporarily store data that is transmitted to and from the powertrain control system 432. The memory controller module that manages the buffer memories may implement the calibration system. In some implementations, the powertrain control system 432 receives inputs from one or more sensors 436 such as temperature sensors, pressure sensors, rotational sensors, airflow sensors and/or any other suitable sensors and/or that generates one or more output control signals 438 such as engine operating parameters, transmission operating parameters, and/or other control signals.

The calibration system may also be implemented in another vehicle control system 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc system and the like. Still other implementations are contemplated.

The powertrain control system 432 may communicate with mass data storage 446 that stores data in a nonvolatile manner. The mass data storage 446 may include optical and/or magnetic storage devices such as hard disk drives (HDDs) and/or DVD drives. At least one HDD may have the configuration shown in FIG. 1 and/or at least one DVD drive may have the configuration shown in FIG. 7A. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via the WLAN interface 448. The control system 440 may also include mass data storage, memory and/or a WLAN interface (all not shown).

Referring now to FIG. 7D, the calibration system can be implemented in a cellular phone 450 that may include a cellular antenna 451. The cellular phone 450 includes either or both signal processing and/or control circuit, which are generally identified in FIG. 7D at 452, a WLAN interface 468, mass data storage 464 and/or a power supply 453. The mass data storage 464 of the cellular phone 450 may implement the calibration system. For example, the mass data storage 464 may include one or more buffer memories that temporarily store data that is transmitted to and from the cellular phone 450. The memory controller module that manages the buffer memories may implement the calibration system. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuit 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices including hard disk drives (HDDs) and/or DVD drives. At least one HDD may have the configuration shown in FIG. 1 and/or at least one DVD drive may have the configuration shown in FIG. 7A. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via the WLAN interface 468.

Figure 7F:
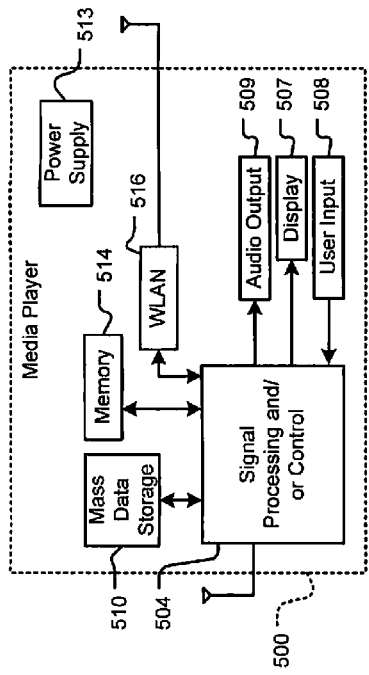
FIG. 7F is a functional block diagram of a media player.
Figure 7E:
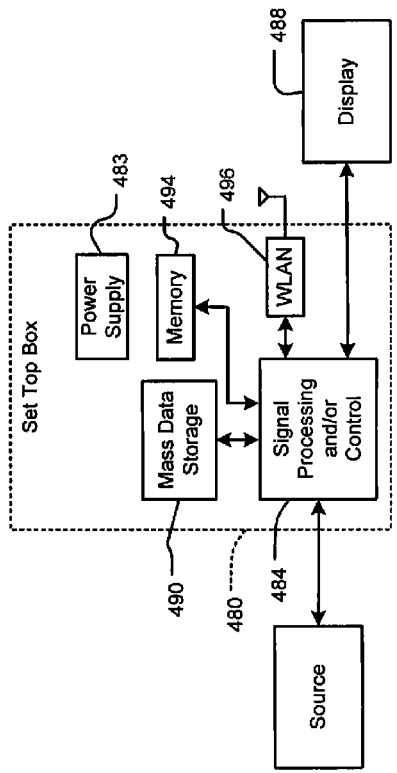
FIG. 7E is a functional block diagram of a set top box.

Referring now to FIG. 7E, the calibration system can be implemented in a set top box 480. The set top box 480 includes either or both signal processing and/or control circuit, which are generally identified in FIG. 7E at 484, a WLAN interface 496, mass data storage 490 and/or a power supply 483. The mass data storage 490 of the set top box 480 may implement the calibration system. For example, the mass data storage 490 may include one or more buffer memories that temporarily store data that is transmitted to and from the set top box 480. The memory controller module that manages the buffer memories may implement the calibration system. The set top box 480 receives signals from a source such as a broadband source and outputs standard and/or high definition audio/video signals suitable for a display 488 such as a television, a monitor and/or other video and/or audio output devices. The signal processing and/or control circuit 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices such as hard disk drives (HDDs) and/or DVD drives. At least one HDD may have the configuration shown in FIG. 1 and/or at least one DVD drive may have the configuration shown in FIG. 7A. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via the WLAN interface 496.

Referring now to FIG. 7F, the calibration system can be implemented in a media player 500. The media player 500 includes either or both signal processing and/or control circuit, which are generally identified in FIG. 7F at 504, a WLAN interface 516, mass data storage 510 and/or a power supply 513. The mass data storage 510 of the media player 500 may implement the calibration system. For example, the mass data storage 510 may include one or more buffer memories that temporarily store data that is transmitted to and from the media player 500. The memory controller module that manages the buffer memories may implement the calibration system. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuit 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage 510 may include optical and/or magnetic storage devices such as hard disk drives (HDDs) and/or DVD drives. At least one HDD may have the configuration shown in FIG. 1 and/or at least one DVD drive may have the configuration shown in FIG. 7A. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via the WLAN interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A calibration module for a data storage device, the calibration module comprising:
a memory configured to buffer data between a host and the data storage device;
a programmable delay module configured to
receive a data strobe signal,
receive a delay value, and
output a delayed data strobe signal to the memory based on the delay value, wherein the data is read from the memory based on the delayed data strobe signal; and
a delay calculation module configured to calculate the delay value based on a comparison between the data strobe signal and the delayed data strobe signal.

2. The calibration module of claim 1, further comprising a pulse detection module configured to:
compare the data strobe signal to the delayed data strobe signal; and
output a pulse detection signal based on the comparison between the data strobe signal and the delayed data strobe signal.

3. The calibration module of claim 1, wherein the comparison between the data strobe signal and the delayed data strobe signal comprises:
a comparison between a phase of the data strobe signal and a phase of the delayed data strobe signal.

4. The calibration module of claim 1, wherein the delay calculation module is configured to calculate the delay value based on a plurality of predetermined delay values.

5. The calibration module of claim 1, wherein delay calculation module is configured to select between the delay value and one of a plurality of predetermined delay values.

6. The calibration module of claim 1, wherein the delay calculation module is configured to calculate the delay value based on a delay threshold value.

7. The calibration module of claim 1, wherein the delay calculation module is configured to calculate the delay value during a calibration cycle, wherein the calibration cycle corresponds to idle periods of the memory.

8. The calibration module of claim 1, wherein the delay calculation module is configured to calculate the delay value further based on a buffer clock signal.

9. The calibration module of claim 1, wherein the programmable delay module is configured to receive the data strobe signal from the memory.

10. A method of operating a data storage control system, the method comprising:
- receiving a data strobe signal;
- receiving a delay value;
- outputting a delayed data strobe signal to a memory based on the delay value, wherein data is read from the memory based on the delayed data strobe signal; and
- calculating the delay value based on a comparison between the data strobe signal and the delayed data strobe signal.

11. The method of claim 10, further comprising:
- comparing the data strobe signal to the delayed data strobe signal; and
- outputting a pulse detection signal based on the comparison between the data strobe signal and the delayed data strobe signal.

12. The method of claim 10, wherein the comparison between the data strobe signal and the delayed data strobe signal comprises:
- a comparison between a phase of the data strobe signal and a phase of the delayed data strobe signal.

13. The method of claim 10, further comprising calculating the delay value based on a plurality of predetermined delay values.

14. The method of claim 10, further comprising selecting between the delay value and one of a plurality of predetermined delay values.

15. The method of claim 10, further comprising calculating the delay value based on a delay threshold value.

16. The method of claim 10, further comprising calculating the delay value during a calibration cycle, wherein the calibration cycle corresponds to idle periods of the memory.

17. The method of claim 10, further comprising calculating the delay value further based on a buffer clock signal.

18. The method of claim 10, further comprising receiving the data strobe signal from the memory.

\* \* \* \* \*